US006509782B2

(12) United States Patent
Chowdhury

(10) Patent No.: US 6,509,782 B2
(45) Date of Patent: Jan. 21, 2003

(54) GENERATION OF A VOLTAGE PROPORTIONAL TO TEMPERATURE WITH STABLE LINE VOLTAGE

(75) Inventor: Vivek Chowdhury, Bracknell (GB)

(73) Assignee: STMicroelectronics Limited, Almondsbury Bristol (GB)

(*) Notice: Subject to any disclaimer, the term of this patent is extended or adjusted under 35 U.S.C. 154(b) by 0 days.

(21) Appl. No.: 09/853,879

(22) Filed: May 11, 2001

(65) Prior Publication Data

US 2002/0044005 A1 Apr. 18, 2002

(30) Foreign Application Priority Data

May 12, 2000 (GB) ........................................ 0011542

(51) Int. Cl.[7] ........................................ H01L 35/00
(52) U.S. Cl. ........................ 327/512; 327/513; 327/538
(58) Field of Search ................................ 327/512, 513, 327/539, 538; 323/312, 313, 314, 316

(56) References Cited

U.S. PATENT DOCUMENTS

| | | | | |
|---|---|---|---|---|
| 4,525,663 A | | 6/1985 | Henry | 323/280 |
| 4,902,959 A | | 2/1990 | Brokaw | 323/44 |
| 5,352,973 A | | 10/1994 | Audy | 323/313 |
| 5,519,354 A | | 5/1996 | Audy | 327/512 |
| 5,686,821 A | | 11/1997 | Brokaw | 323/273 |
| 5,982,162 A | * | 11/1999 | Yamauchi | 323/316 |
| 6,028,478 A | | 2/2000 | Seremeta et al. | 330/252 |
| 6,037,833 A | | 3/2000 | Ang | 327/543 |
| 6,064,275 A | * | 5/2000 | Yamauchi | 331/57 |
| 6,087,813 A | * | 7/2000 | Tobita | 323/280 |

FOREIGN PATENT DOCUMENTS

DE 42 24 584 A 1/1994

OTHER PUBLICATIONS

Standard Search Report from United Kingdom application No. 011542.

* cited by examiner

*Primary Examiner*—Tuan T. Lam
*Assistant Examiner*—Hiep Nguyen
(74) *Attorney, Agent, or Firm*—Wolf, Greenfiel & Sacks, P.C.; James H. Morris; Robert A. Skrivanek, Jr.

(57) ABSTRACT

A circuit for generating an output voltage which is proportional to temperature with a required gradient is disclosed. The circuit relies on the principle that the difference in the base emitter voltage of two bipolar transistors with differing areas, if appropriately connected, can result in a current which has a positive temperature coefficient, that is a current which varies linearly with temperature such that as the temperature increases the current increases. It is important to maintain a stable internal line voltage in the face of significant variations in a supply voltage to the circuit. This is achieved herein by providing control elements appropriately connected to a differential amplifier. The stable internal supply voltage can be used to power a subsequent stage of the circuit for fine control of the gradient of the voltage proportional to temperature.

11 Claims, 5 Drawing Sheets

GENERATION OF A VOLTAGE PROPORTIONAL TO TEMPERATURE WITH STABLE LINE VOLTAGE

FIELD OF THE INVENTION

The present invention relates to a circuit for generating an output voltage which is proportional to temperature with a required gradient.

BACKGROUND OF THE INVENTION

Such circuits exist which rely on the principle that the difference in the base emitter voltage of two bipolar transistors with differing areas, if appropriately connected, can result in a current which has a positive temperature coefficient, that is a current which varies linearly with temperature such that as the temperature increases the current increases. This current, referred to herein as Iptat, can be used to generate a voltage proportional to absolute temperature, Vptat, when supplied across a resistor.

Although this principle is sound, a number of difficulties exist in converting this principle to practical application.

One such practical difficulty is the need to maintain a stable internal line voltage in the face of significant variations in a supply voltage. This should be done without unnecessarily increasing the number of components in the circuit over and above those which are required to generate the voltage proportional to temperature.

SUMMARY OF THE INVENTION

The present invention provides a circuit for generating an output voltage proportional to temperature with a required gradient, the circuit comprising: first and second bipolar transistors with different emitter areas having their emitters connected together and their bases connected across a bridge resistive element, wherein the collectors of the transistors are connected to an internal supply line via respective matched resistive elements such that the voltage across the bridge resistive element is proportional to temperature; a differential amplifier having its inputs connected respectively to said collectors and its output connected to a control terminal of a first control element having a controllable path connected between a first power supply rail and a control node; a second control element having a controllable path connected between the control node and a second power supply rail; and a third control element having a control terminal connected to the control node and a controllable path connected between the second power supply rail and an internal supply line, whereby the differential amplifier and the first, second and third control elements cooperate to maintain a stable voltage on the internal supply line despite variations between the first and second power supply rails.

In the described embodiment the stable voltage on the internal supply line is used to power components of a second stage which allows fine adjustment of the predetermined gradient of the voltage proportional to temperature.

In the described embodiment, the voltage on the internal supply line is set from the voltage proportional to absolute temperature using that voltage in conjunction with two bipolar transistors connected in series via a resistor to an output node at which a voltage proportional to absolute temperature with a predetermined gradient is generated.

Thus, the embodiments of the invention described in the following focus on line regulation of a circuit such that if the supply voltage to a chip increases, the output of the temperature sensor does not change (or only very minutely). This is done by having a constant internal supply line for the major circuitry which is quite stable with temperature. If this does not change, then the assumption can be made that the local supply ($V_{ddint}$) is constant.

In the following described embodiments, three components in particular are discussed:

(i) The value on the internal supply line ($V_{ddint}$) is set by the voltage across the bridge resistive element and two bipolar transistors connected in series, using the current proportional to absolute temperature which is generated in the circuit.

(ii) The drop of voltage between the first and second power supply rail and the internal supply line ($V_{ddint}$) appears across the collector/emitter of the third control element. The bias for that control element is provided by the first and second control elements.

(iii) The third control element also can provide the current supply for the internal supply line. Any disturbance of current or voltage on the internal supply line loops back through the resistive bridge element, ΔVbe generator, differential amplifier to the first and second biasing control elements and to the third control element.

For a better understanding of the present invention and to show how the same may be carried into effect reference will now be made by way of example to the accompanying drawings.

DESCRIPTION OF THE PREFERRED EMBODIMENT

The present invention is concerned with a circuit for the generation of a voltage proportional to absolute temperature (Vptat). The circuit has two stages which are referred to herein as the first stage and the second stage. In the first stage, a "raw" voltage Vptat is generated, and in the second stage a calibrated voltage for measurement purposes is generated from the "raw" voltage.

Figure 1:
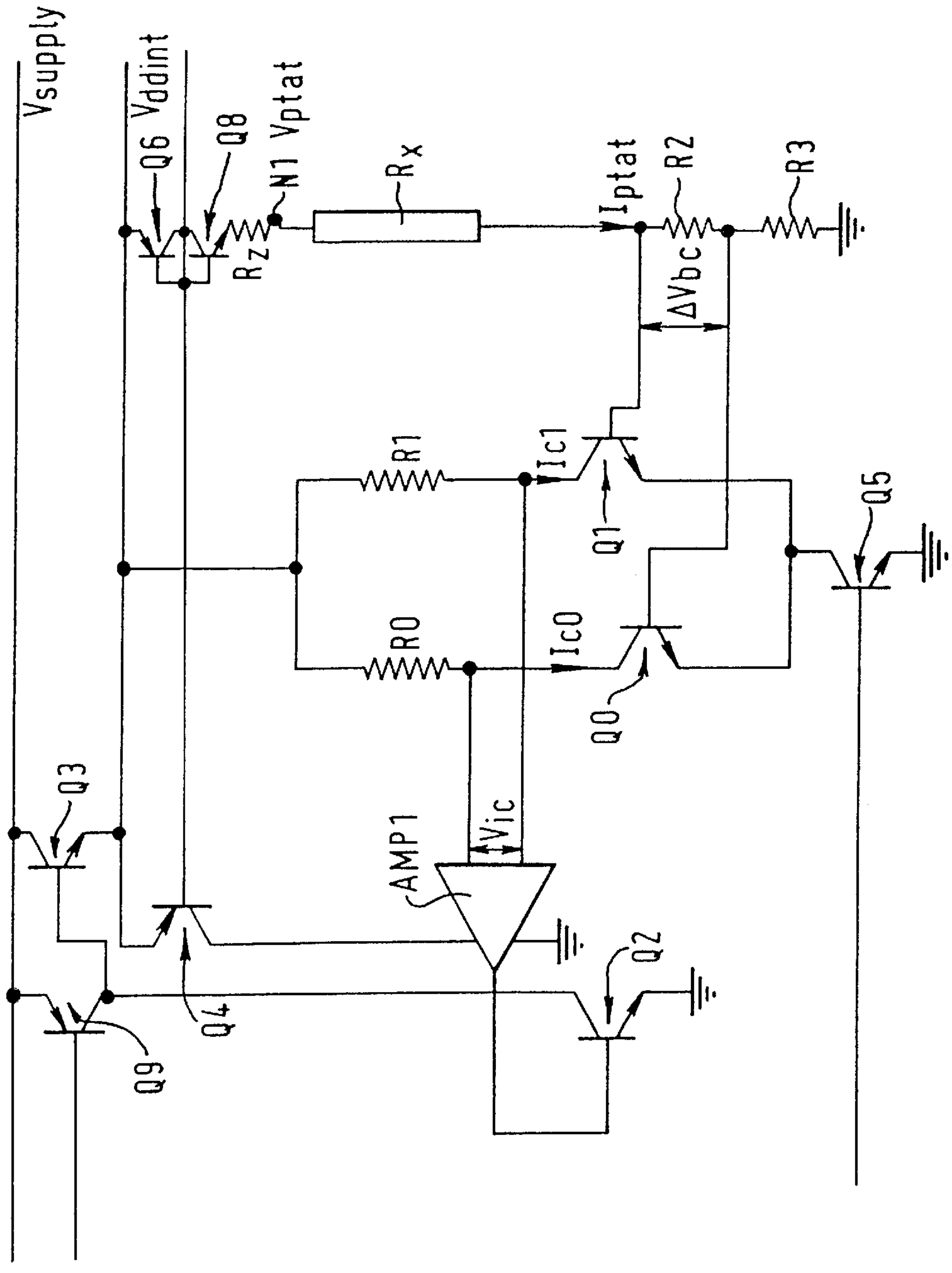
FIG. 1 represents circuitry of the first stage.

FIG. 1 illustrates one embodiment of the first stage. The core of the voltage generation circuit comprises two bipolar transistors Q0,Q1 which have different emitter areas. The difference ΔVbe between the base emitter voltages Vb(Q1)−Vb(Q0) is given to the first order by the equation (1):

$$\Delta Vbe = \frac{KT.}{q} \ln \frac{Ic_1 Is_0}{Ic_0 Is_1} \qquad (1)$$

where K is Boltzmanns constant, T is temperature, q is the electron charge, $Ic_0$ is the collector current through the transistor Q0, $Ic_1$ is the collector current through the transistor Q1, $Is_0$ is the saturation current of the transistor Q0 and $Is_1$ is the saturation current of the transistor Q1. As is well known, the saturation current is dependent on the emitter area, such that the ratio $Is_0$ divided by $Is_1$ is equal to the ratio of the emitter area of the transistor Q0 to the emitter area of the transistor Q1. In the described embodiment, that ratio is 8. Also, the circuit illustrated in FIG. 1, is arranged so that the collector currents $Ic_1$ and $Ic_0$ are maintained equal, such that their ratio is 1, as discussed in more detail in the following. Therefore, to a first approximation, $$\Delta Vbe = \frac{KT.}{q}\ln 8 \tag{1a}$$

The difference ΔVbe is dropped across a bridge resistor R2 to generate a current proportional to absolute temperature Iptat, where:

$$Iptat = \frac{\Delta Vbe}{R2} \tag{2}$$

This current Iptat is passed through a resistive chain Rx to generate the temperature dependent voltage Vptat at a node N1. A resistor R3 is connected between R2 and ground.

With R2 equal to 18 kOhms, substituting the values in equations (1) and (2) above, Iptat is in the range 2.5 $\mu$A to 3 $\mu$A over a temperature range of −20 to 100° C. The temperature dependent voltage Vptat is given by:

$$Vptat = Iptat \times (R2 + R3 + Rx) = \frac{KT \ln 8}{q}\frac{(R2 + R3 + Rx)}{R2} \tag{3}$$

To get a relationship of the temperature dependent voltage Vptat variation with temperature, we differentiate the above equation to obtain:

$$\frac{d\,Vptat}{d\,T} = K \ln 8 \frac{(R2 + R3 + Rx)}{q \times R2} \tag{4}$$

With the values indicated above R2+18K, R3=36K, Rx=85K, the variation of voltage with temperature is 4.53 mV/° C.

Before discussing how Vptat is modified in the second stage, other attributes of the circuit of the first stage will be discussed.

The collector currents $Ic_1$, $Ic_0$ are forced to be equal by matching resistors R0, R1 in the collector paths as closely as possible. However, it is also important to maintain the collector voltages of the transistors Q0,Q1 as close to one another as possible to match the collector currents. This is achieved by connecting the two inputs of a differential amplifier AMP1 to the respective collector paths. The amplifier AMP1 is designed to hold its inputs very close to one another. In the described embodiments, the input voltage Vio of the amplifier AMP1 is less then 1 mV so that the matching of the collector voltages of the transistors Q0,Q1 is very good. This improves the linearity of operation of the circuit.

Vddint denotes an internal line voltage which is set and stabilised as described in the following. A transistor Q4 has its emitter connected to $V_{ddint}$ and its collector connected to the amplifier AMP1 to act as a current source for the amplifier AMP1. It is connected in a mirror configuration with a bipolar transistor Q6 which has its base connected to its collector. The transistor Q6 is connected in series to an opposite polarity transistor Q8, also having its base connected to its collector.

The bipolar transistors Q8 and Q6 assist in setting the value of the internal line voltage $V_{ddint}$ at a stable voltage to a level given by, to a first approximation, $$V_{ddint} = Iptat(R3+R2+Rx+Rz)+Vbe(Q6)+Vbe(Q8) \tag{5}$$

According to the principal on which bandgap voltage regulators are based, as Vptat increases with temperature, the Vbe of transistors Q6 and Q8 decrease due to the temperature dependence of Vbe in a bipolar transistor. Thus, $V_{ddint}$ is a reasonably stable voltage because the decrease across Q6 and Q8 with rising temperature is compensated by the increase in Vptat.

The amplifier AMP1 has a secondary purpose, provided at no extra overhead, to the main purpose of equalising the collector voltages Q0 and Q1, discussed above. The secondary use is for stabilising the line voltage $V_{ddint}$. Imagine if $V_{ddint}$ is disturbed by fluctuating voltage or current due to excessive current taken from the second stage (discussed later) or noise or power supply coupling onto it. The voltage on line $V_{ddint}$ will go up or down slightly. If $V_{ddint}$ goes higher, then the potential at resistor R2 and R3 will rise. Icl will increase slightly more than $Ic_0$ and the difference across AMP1 increases. AMP1 is a transconductance amplifier and as the Vic increases more current is drawn through Q2, i.e. $Ic_2$ increases. Q3 is starved of base current and switches off allowing $V_{ddint}$ to recover by current discharge through the resistor bridge. The opposite occurs when $V_{ddint}$ goes low in which case AMP1 supplies less current to the base of Q2 therefore the current $Ic_2$ decreases and mor ecurrent from Q9 can go to the base of Q3 allowing more drive current $Ic_3$ to supply $V_{ddint}$. In effect there is some stabilisation.

The base of a transistor Q9 connected between the transistor Q2 and $V_{supply}$ is connected to receive a start-up signal from a start-up circuit (not shown). The transistor Q9 acts as a current source for the transistor Q2. An additional bipolar transistor Q5 is connected between the common emitter connection of the voltage generating transistors Q0,Q1 and has its base connected to receive a start-up signal from the start-up circuit. It functions as the "tail" of the Vptat transistors Q0,Q1.

The temperature dependent voltage Vptat generated by the first stage illustrated in FIG. 1 has a good linear variation at the calculated slope 4.53 mV/° C. However, the internal line voltage $V_{ddint}$ limits the swing in the upper direction, and also Vptat cannot go down to zero.

Figure 2:
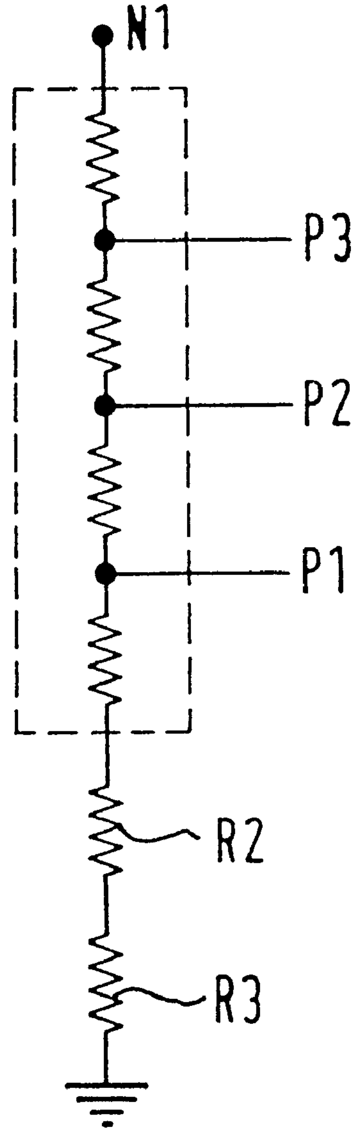
FIG. 2 represents construction of a resistive chain.

It will be appreciated that the resistive chain Rx constitutes a sequence of resistors connected in series as illustrated for example in FIG. 2. The slope of the temperature dependent voltage is dependent on the resistive value in the resistive chain Rx and thus can be altered by tapping off the voltage at different points P1,P2,P3 in FIG. 2.

Figure 3:
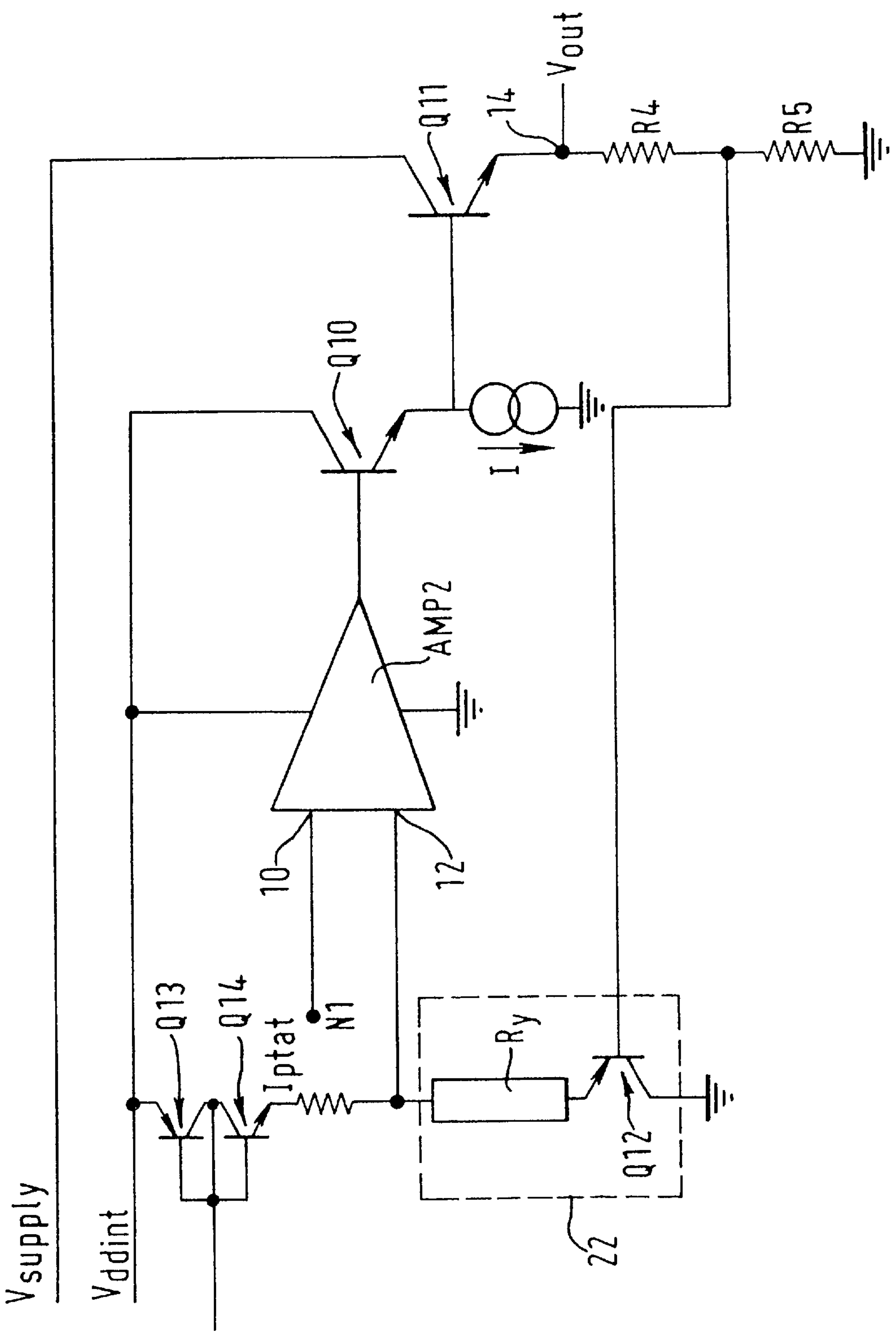
FIG. 3 represents circuitry of the second stage.

FIG. 3 illustrates the second stage of the circuit which functions as a gain stage. The circuit comprises a differential amplifier AMP2 having a first input 10 connected to receive the temperature dependent voltage Vptat at node N1 from the first stage and a second input 12 serving as a feedback input. The output of the differential amplifier AMP2 is connected to a Darlington pair of transistors Q10, Q11. The emitter of the second transistor Q11 in the Darlington pair supplies an output voltage Vout at node 14. The amplifier AMP2 and the first Darlington transistor Q10 are connected to the stable voltage line $V_{ddint}$ supplied by the first stage. The second Darlington transistor is connected to $V_{supply}$.

The output voltage Vout is a voltage which is proportional to temperature with a required gradient and which can move negative with negative temperatures.

The adjustment of the slope of the temperature versus voltage curve is achieved in the second stage by a feedback loop for the differential amplifier AMP2. The feedback loop comprises a gain resistor R4 connected between the output terminal 14 at which the output voltage Vout is taken and the base of a feedback transistor Q12. The collector of the feedback transistor Q12 is connected to ground and its emitter is connected into a resistive chain Ry, the value of which can be altered and which is constructed similarly to the resistive chain Rx in FIG. 2. A resistor R5 is connected between the resistor R4 and ground. The gain of the feedback loop including differential amplifier AMP2 can be adjusted by altering the ratio:

$$\frac{R4 + R5}{R5} \quad (6)$$

Figure 4:
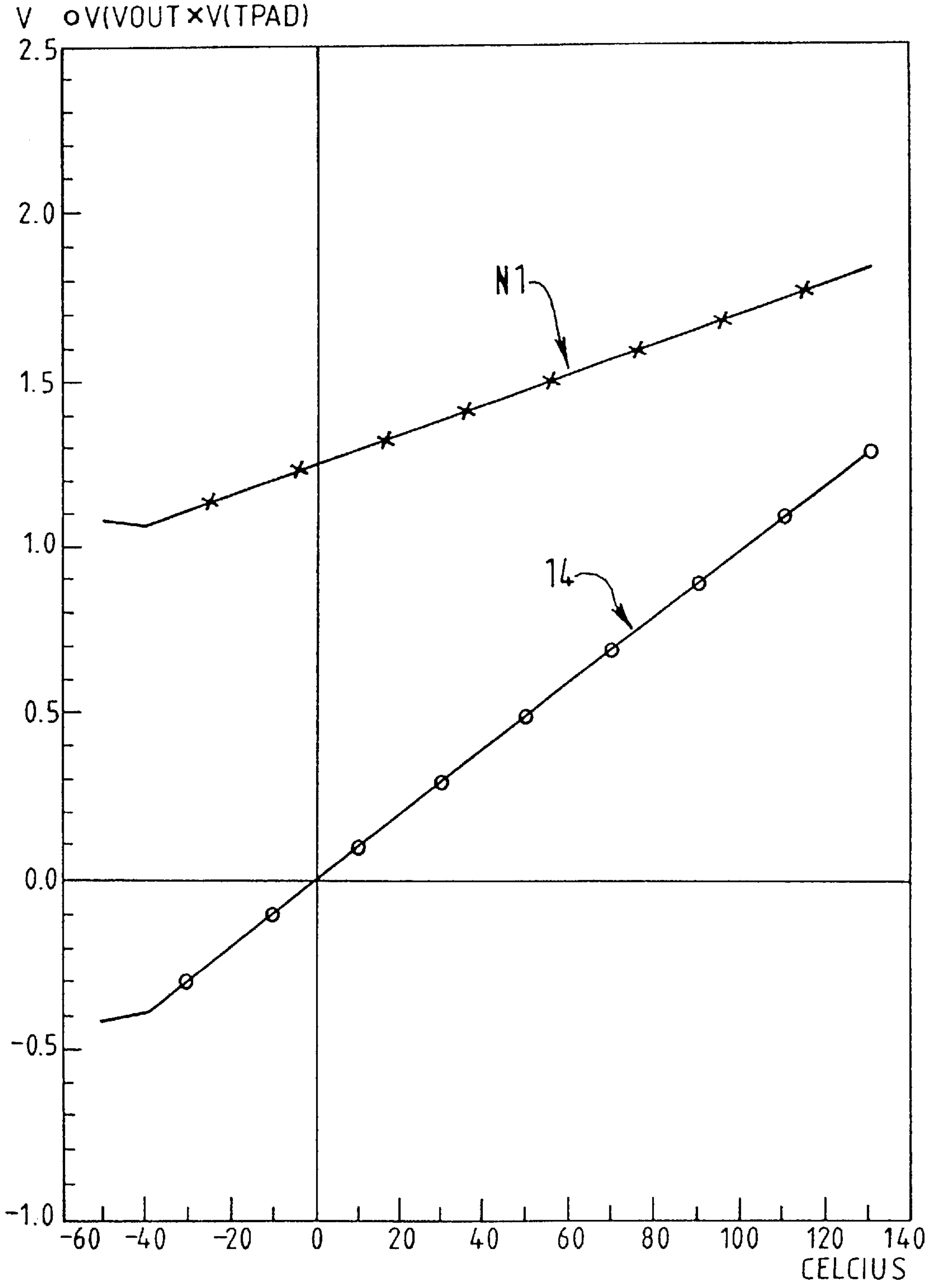
FIG. 4 is a graph illustrating the variation of temperature with voltage for circuits with and without use of the present invention.

This allows the slope of the incoming temperature dependent voltage Vptat to be adjusted between the gradient produced by the first stage at N1 and the required gradient at the output terminal 14. In the described example, the slope of the temperature dependent voltage Vptat at N1 with respect to temperature is 4.53 mV/° C. This is altered by the second stage to 10 mV/° C. This is illustrated in FIG. 4 where the crosses denote the relationship of voltage and temperature at N1 and the diamonds denote the relationship of voltage to temperature for the output voltage at the output node 14.

As has already been mentioned, the voltage Vptat at the node N1 cannot move into negative values even when the temperature moves negative. The second stage of the circuit accomplishes this by providing an offset circuit 22 connected to the input terminal 12 of the differential amplifier AMP2. The offset circuit 22 comprises the resistor chain Ry and the transistor Q12. Together these components provide a relatively stable bandgap voltage of about 1.25 V. The resistive chain Ry receives the current Iptat mirrored from the first stage via two bipolar transistors Q13, Q14 of opposite types which are connected in opposition and which cooperate with the transistors Q6 and Q8 of the first stage to act as a current mirror to mirror the temperature dependent current Iptat. As Iptat increases with temperature, Vbe(Q12) decreases. This offset circuit 22 introduces a fixed voltage offset at the input terminal 12, thus shifting the line of voltage with respect to temperature. This shift can be seen in FIG. 4, where the curve of the output voltage Vout at node 14 can be seen to pass through zero and move negative at negative temperatures.

From the above description it can be seen that the "bridge" network in the first stage performs a number of different functions, as follows. Firstly, it provides a temperature related voltage Vptat at the node N1. Secondly, it assists in providing a relatively fixed internal supply voltage $V_{ddint}$ even in the face of external supply variations, thus giving good line regulation for the gain circuit of the second stage. Thirdly, it provides in conjunction with the current mirror transistors Q4,Q6 current biasing for the amplifier AMP1 of the first stage. Fourthly, it provides, through the mirroring of transistors Q6,Q13 current biasing for the resistive chain Ry in the offset circuit 22 of the second stage.

Table 1 illustrates the operating parameters of one particular embodiment of the circuit. To achieve the operating parameters given in Table 1, adjustment can be made using the resistive chain Rx implemented in the manner illustrated in FIG. 2 to adjust the slope of Vptat in the first stage.

Alternatively, the slope may be adjusted in the second stage by altering the gain resistors R4, R5.

TABLE 1

| Parameter | Conditions | Min | Typ | Max | Units |
|---|---|---|---|---|---|
| Accuracy | T = 25 C.<br>−30 < T < 130 C. | | | ±2 | deg C. |
| Sensor Gain | −30 < T < 130 C. | | 10 | | mv/deg C. |
| Load Regulation | 0 < Iout < 1 mA | | | 15 | mV/mA |
| Line Regulation | 4.0 < VCC < 11 V | | | ±0.5 | mV/V |
| Quiescent current | 4.0 < VCC < 11 V<br>T = 25 C. | | | 80 | uA |
| Operating supply range | | 4 | | 11 | V |
| Output voltage offset | | | 0 | | V |

Figure 5:
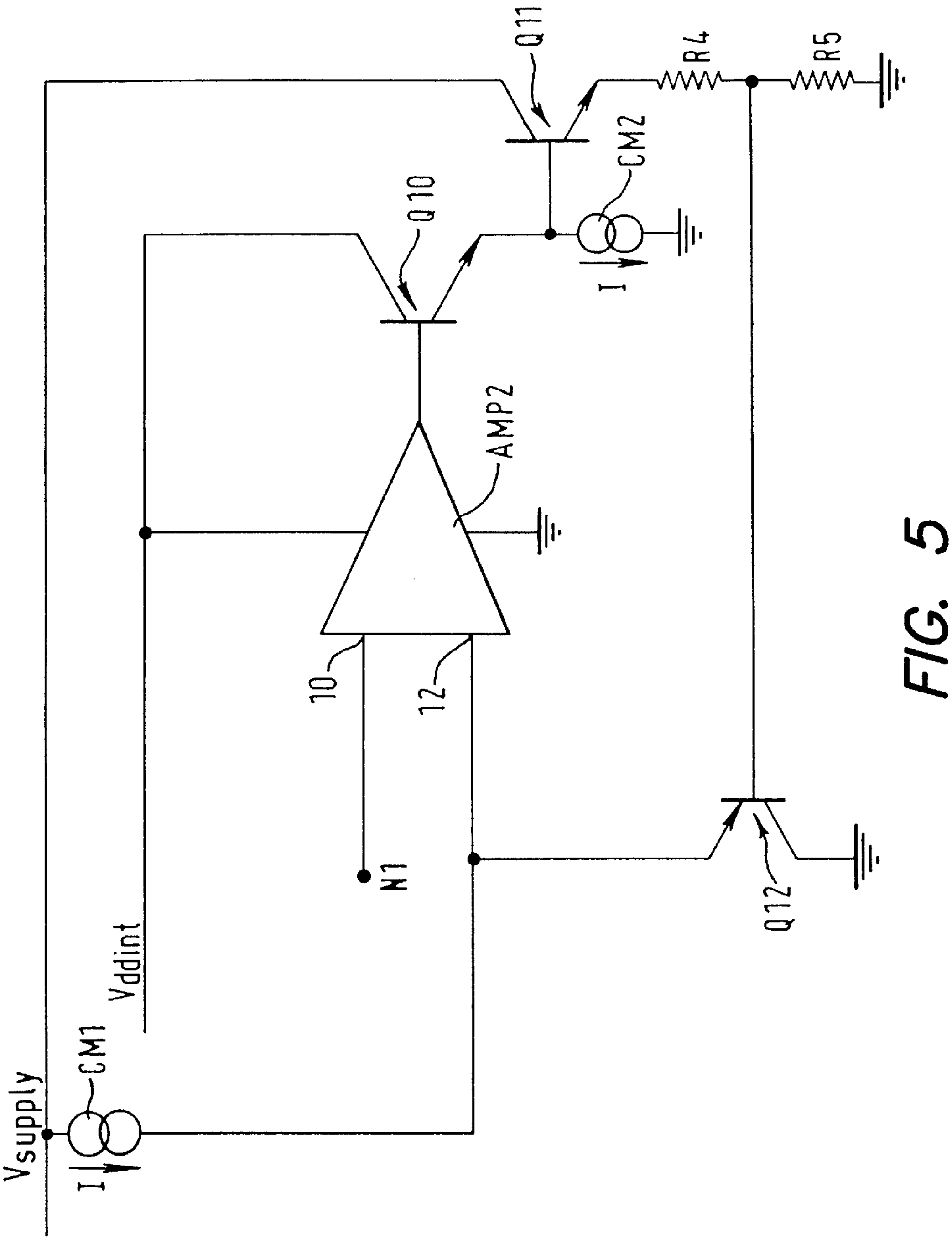
FIG. 5 represents circuitry of another form of second stage.

FIG. 5 represents an alternative second stage which includes a differential amplifier AMP2 in a feedback loop as in the circuit of FIG. 3. However, the second stage illustrated in FIG. 5 differs from that in FIG. 3 in that there is no offset circuit. Instead, the transistor Q12 is connected via a current mirror CM1 to the supply line $V_{supply}$. This second stage allows the gradient of the temperature dependent voltage at node N1 to be altered but does not allow it to move negative with negative temperatures. CM2 denotes a second current mirror in the circuit of FIG. 5. The second stage of FIG. 5 nevertheless still makes use of the stable internal voltage supply line $V_{ddint}$ to supply the differential amplifier AMP2. Table II illustrates the operating parameters of an embodiment of the invention using the stage of FIG. 5.

TABLE II

| Parameter | Conditions | Min | Typ | Max | Units |
|---|---|---|---|---|---|
| Accuracy | −30 < T < 130 C. | | | ±2 | Deg C. |
| Sensor Gain | −30 < T > 100 C. | | 10 | | mv/deg C. |
| Load Regulation | 0 < Iout < 1 mA | | | ±15 | mV/mA |
| Line Regulation | 4.0 < VCC < 10 V | | | ±0.5 | mV/V |
| Quiescent current | 4.0 < VCC < 10 V | | | 80 | uA |
| Operating supply range | | 4.5 | | 11 | V |
| Output voltage offset | | | 0.81 | | V |

For the circuit of FIG. 5, −10° C. = 0.71 V, −20° C. = 0.61 V, −30° C. = 0.51 V, 100° C. = 1.81 V.

What is claimed is:

1. A circuit for generating an output voltage proportional to temperature with a required gradient, the circuit comprising:

first and second bipolar transistors with different emitter areas having their emitters connected together and their bases connected across a bridge resistive element, wherein the collectors of the transistors are connected to an internal supply line via respective matched resistive elements such that the voltage across the bridge resistive element is proportional to temperature;

a differential amplifier having its inputs connected respectively to said collectors and its output connected to a control terminal of a first control element, the first control element having a controllable path connected between a first power supply rail and a control node;

a second control element having a controllable path connected between the control node and a second power supply rail; and a third control element having a control terminal connected to the control node and a controllable path connected between the second power supply rail and the internal supply line, whereby the differential amplifier and the first, second and third control elements cooperate to maintain a stable voltage on the internal supply line despite variations between the first and second power supply rails.

2. A circuit according to claim 1, wherein the current flowing through the bridge resistive element is a temperature dependent current which is also supplied through a first resistive chain to generate at an output node of the circuit a voltage proportional to temperature with a predetermined gradient determined by the first resistive chain.

3. A circuit according to claim 2, which comprises first and second bipolar transistors of opposite polarity connected in series between the internal supply line and the output node which serve to set the voltage on the internal supply line.

4. A circuit according to claim 3, wherein the first and second transistors cooperate with a current supply element to generate a supply current for the differential amplifier.

5. A circuit according to any preceding claim, wherein the first, second and third control elements are bipolar transistors with the base constituting the control terminal and the collector emitter path constituting the controllable path.

6. The circuit according to claim 1, wherein the differential amplifier is a first differential amplifier, the circuit further comprising a second differential amplifier having a first input connected to receive the voltage across the bridge resistive element that is proportional to temperature and a second input connected to receive a feedback voltage which is derived from an output signal of the second differential amplifier whereby the gain of the feedback voltage can be adjusted.

7. A circuit according to claim 6, wherein the second differential amplifier is powered by the stable voltage on the internal supply line.

8. A circuit according to claim 2 or 3, wherein the required gradient is programmable through variation of the resistance of the first resistive chain.

9. A circuit according to claim 6 or 7, wherein the feedback voltage is derived from the output signal of the second differential amplifier via an offset circuit which introduces an offset voltage such that the output signal of the second differential amplifier provides at an output node an output voltage which has a negative variation with negative temperature.

10. A circuit according to claim 9, wherein the offset circuit comprises a bipolar transistor connected in series with a resistive element.

11. A circuit according to claims 2 and 10, wherein the temperature dependent current from the circuit is mirrored into the second stage to flow through the resistive element of the offset circuit.

* * * * *

UNITED STATES PATENT AND TRADEMARK OFFICE

CERTIFICATE OF CORRECTION

PATENT NO. : 6,509,782 B2
DATED : January 21, 2003
INVENTOR(S) : Vivek Chowdhury It is certified that error appears in the above-identified patent and that said Letters Patent is hereby corrected as shown below:

Column 8,
Line 21, should read -- A circuit according to claim 2 or 10, wherein the --

Signed and Sealed this

Twenty-fourth Day of June, 2003

JAMES E. ROGAN
*Director of the United States Patent and Trademark Office*